United States Patent
Fan et al.

(10) Patent No.: US 7,485,906 B2
(45) Date of Patent: Feb. 3, 2009

(54) COLORS ONLY PROCESS TO REDUCE PACKAGE YIELD LOSS

(75) Inventors: Yang-Tung Fan, Jubei (TW);
Chiou-Shian Peng, Hsinchu (TW);
Cheng-Yu Chu, Hsinchu (TW);
Shih-Jane Lin, Hsin-Chu (TW);
Yen-Ming Chen, Hsinchu (TW);
Fu-Jier Fan, Jubei (TW); Kuo-Wei Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 63 days.

(21) Appl. No.: 11/642,225

(22) Filed: Dec. 20, 2006

(65) Prior Publication Data
US 2007/0120155 A1 May 31, 2007

Related U.S. Application Data

(60) Continuation of application No. 11/037,445, filed on Jan. 18, 2005, now Pat. No. 7,183,598, which is a continuation of application No. 10/272,136, filed on Oct. 16, 2002, now Pat. No. 6,876,049, which is a division of application No. 09/867,379, filed on May 30, 2001, now Pat. No. 6,482,669.

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/288; 257/98; 257/292; 257/E21.185; 257/E21.189; 257/E27.134; 257/E27.142

(58) Field of Classification Search .............. 257/288, 257/291, 292, 204, 98, 89, 88, 79, 69, 59
See application file for complete search history.

(56) References Cited

U.S. PATENT DOCUMENTS

| | | | |
|---|---|---|---|
| 4,870,268 A * | 9/1989 | Vincent et al. | ............. 250/226 |
| 5,595,930 A | 1/1997 | Baek | |
| 5,672,519 A | 9/1997 | Song et al. | |
| 5,691,548 A | 11/1997 | Akio | |
| 5,693,967 A | 12/1997 | Park et al. | |
| 5,796,154 A | 8/1998 | Sano et al. | |
| 5,844,290 A | 12/1998 | Furumiya | |
| 5,976,907 A * | 11/1999 | Shigeta et al. | ............. 438/65 |

(Continued)

*Primary Examiner*—David Nhu

(57) ABSTRACT

Disclosed is an ordered microelectronic fabrication sequence in which color filters are formed by conformal deposition directly onto a photodetector array of a CCD, CID, or CMOS imaging device to create a concave-up pixel surface, and, overlayed with a high transmittance planarizing film of specified index of refraction and physical properties which optimize light collection to the photodiode without additional conventional microlenses. The optically flat top surface serves to encapsulate and protect the imager from chemical and thermal cleaning treatment damage, minimizes topographical underlayer variations which would aberrate or cause reflection losses of images formed on non-planar surfaces, and, obviates residual particle inclusions induced during dicing and packaging. A CCD imager is formed by photolithographically patterning a planar-array of photodiodes on a semiconductor substrate. The photodiode array is provided with metal photoshields, passivated, and, color filters are formed thereon. A transparent encapsulant is deposited to planarize the color filter layer and completes the solid-state color image-forming device without conventional convex microlenses.

20 Claims, 6 Drawing Sheets

U.S. PATENT DOCUMENTS

| | | |
|---|---|---|
| 6,040,591 A | 3/2000 | Otsuka |
| 6,091,093 A | 7/2000 | Kang et al. |
| 6,171,883 B1 | 1/2001 | Fan et al. |
| 6,171,885 B1 * | 1/2001 | Fan et al. .................... 438/70 |
| 6,482,669 B1 | 11/2002 | Fan et al. |
| 6,682,659 B1 | 1/2004 | Cho et al. |

* cited by examiner

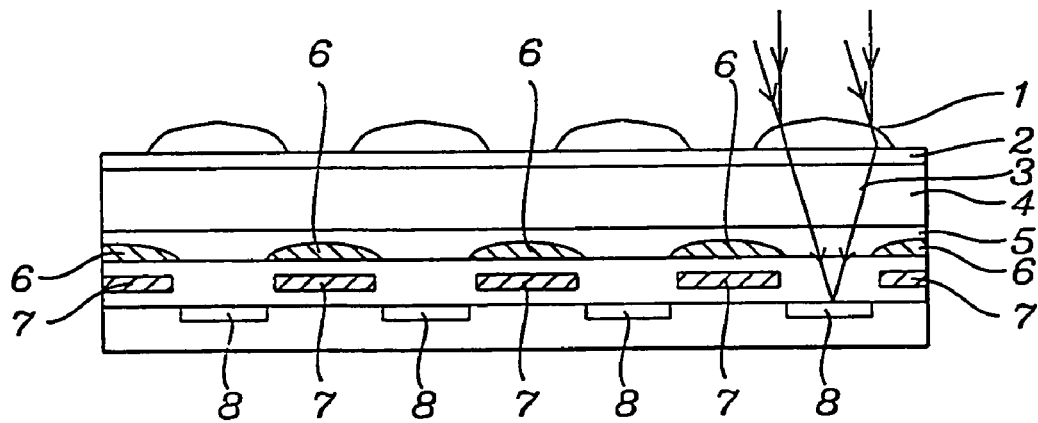
FIG. 1 — Prior Art
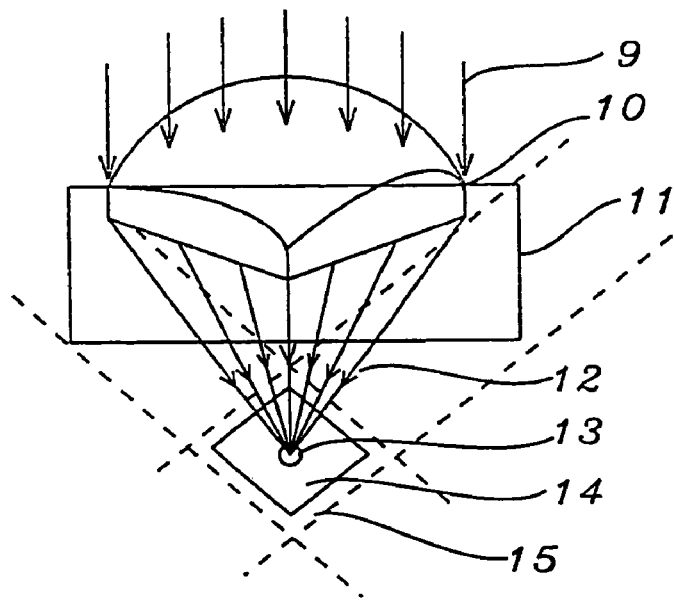
FIG. 2 — Prior Art

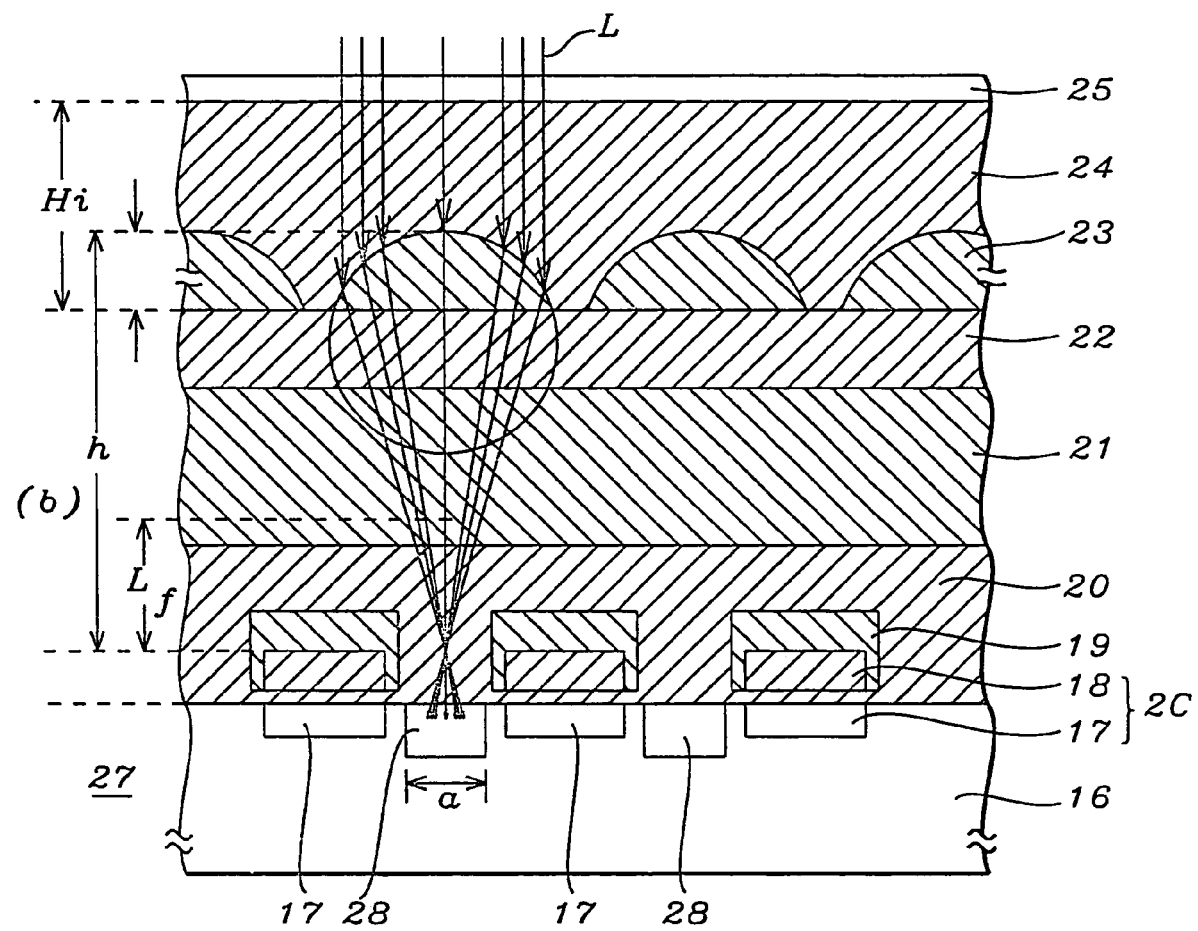
FIG. 3 – Prior Art

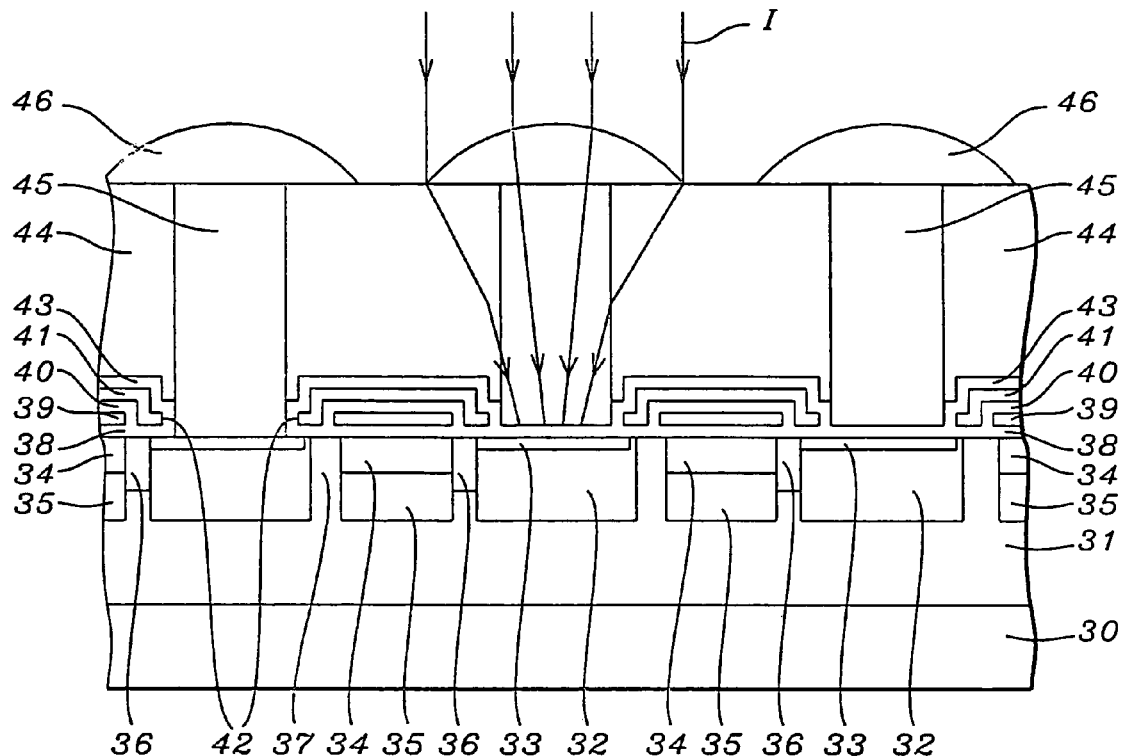
FIG. 4 – Prior Art
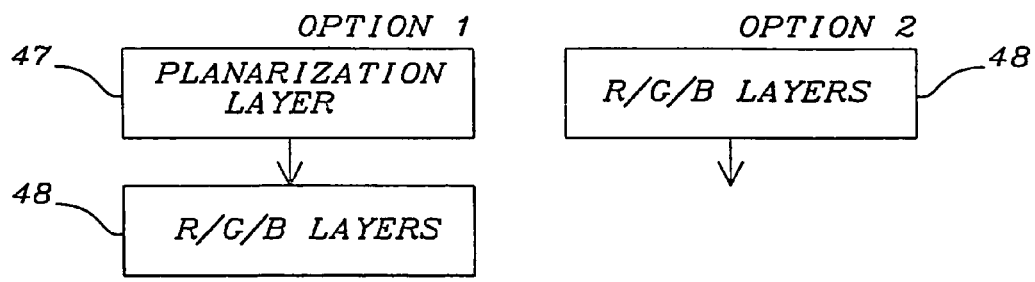
FIG. 5A

COLORS ONLY PROCESS TO REDUCE PACKAGE YIELD LOSS

CROSS REFERENCE TO RELATED APPLICATION

This is a continuation of U.S. non-provisional patent application Ser. No. 11/037,445, filed Jan. 18, 2005, by Fan et al., titled "Colors Only Process to Reduce Package Yield Loss," now issued pat. No. 7,183,598, which is a continuation of U.S. non-provisional patent application No. 10/272,136, filed Oct 16, 2002, by Fan et al., titled "Colors Only Process to Reduce Package Yield Loss," now issued Pat. No. 6,876,049, which is a divisional application of U.S. non-provisional patent application No. 09/867,379, filed May 30, 2001, by Fan et al., titled "Colors Only Process to Reduce Package Yield Loss," now issued as U.S. Pat. No. 6,482,669, the entire contents of which applications and patents are incorporated herein by reference.

BACKGROUND OF THE INVENTION (1) Field of the Invention

The present invention relates to light collection efficiency and package yield improvements for the optical structure and microelectronic fabrication process of semiconductor color imaging devices.

(2) Description of Prior Art

Synthetic reconstruction of color images in solid-state analog or digital video cameras is conventionally performed through a combination of an array of optical microlens and spectral filter structures and integrated circuit amplifier automatic gain control operations following a prescribed sequence of calibrations in an algorithm.

Typically solid-state color cameras are comprised of charge-coupled device (CCD), Charge-Injection Device (CID), or Complementary Metal-Oxide Semiconductor (CMOS) structures with planar arrays of microlenses and primary color filters mutually aligned to an area array of photodiodes patterned onto a semiconductor substrate. The principal challenge in the design of solid-state color camera devices is the trade-off between adding complexity and steps to the microelectronic fabrication process wherein color filters are integrally formed in the semiconductor cross-sectional structure versus adding complexity and integrated electronic circuitry for conversion of the optical analog signals into digital form and signal processing with color-specific automated gain-control amplifiers requiring gain-ratio balance. The trade-off between microelectronic fabrication process complexity versus electronic complexity is determined by a plurality of factors, including product manufacturing cost and optoelectronic performance.

Color-photosensitive integrated circuits require carefully configured color filters to be deposited on the upper layers of a semiconductor device in order to accurately translate a visual image into its color components. Conventional configurations may generate a color pixel by employing four adjacent pixels on an image sensor. Each of the four pixels is covered by a different color filter selected from the group of red, blue and two green pixels, thereby exposing each monochromatic pixel to only one of the three basic colors. Simple algorithms are subsequently applied to merge the inputs from the three monochromatic pixels to form one full color pixel. The color filter deposition process and its relationship to the microlens array formation process determine the production cycle-time, test-time, yield, and ultimate manufacturing cost. It is an object of the present invention to teach color-filter processes which optimize these stated factors without the microlens array(s) and the associated complex process steps.

While color image formation may be accomplished by recording appropriately filtered images using three separate arrays, such systems tend to be large and costly. Cameras in which a full color image is generated by a single detector array offer significant improvements in size and cost but have inferior spatial resolution. Single-chip color arrays typically use color filters that are aligned with individual columns of photodetector elements to generate a color video signal. In a typical stripe configuration, green filters are used on every other column with the intermediate columns alternatively selected for red or blue recording. To generate a color video signal using an array of this type, intensity information from the green columns is interpolated to produce green data at the red and blue locations. This information is then used to calculate a red-minus-green signal from red-filtered columns and a blue-minus-green signal from the blue ones.

Complete red-minus-green and blue-minus-green images are subsequently interpolated from this data yielding three complete images. Commercial camcorders use a process similar to this to generate a color image but typically utilize more complicated mosaic-filter designs. The use of alternate columns to yield color information decreases the spatial resolution in the final image.

The elementary unit-cell of the imager is defined as a pixel, characterized as an addressable area element with intensity and chroma attributes related to the spectral signal contrast derived from the photon collection efficiency. Prior art conventionally introduces a microlens on top of each pixel to focus light rays onto the photosensitive zone of the pixel.

The optical performance of semiconductor imaging arrays depends on pixel size and the geometrical optical design of the camera lens, microlenses, color filter combinations, spacers, and photodiode active area size and shape. The function of the microlens is to efficiently collect incident light falling within the acceptance cone and refract this light in an image formation process onto a focal plane at a depth defined by the planar array of photodiode elements. Significant depth of focus may be required to achieve high resolution images and superior spectral signal contrast since the typical configuration positions the microlens array at the top light collecting surface and the photosensors at the semiconductor substrate surface.

When a microlens element forms an image of an object passed by a video camera lens, the amount of radiant energy (light) collected is directly proportional to the area of the clear aperture, or entrance pupil, of the microlens. At the image falling on the photodiode active area, the illumination (energy per unit area) is inversely proportional to the image area over which the object light is spread. The aperture area is proportional to the square of the pupil diameter and the image area is proportional to the square of the image distance, or focal length. The ratio of the focal length to the clear aperture of the microlens is known in Optics as the relative aperture or f-number.

The illumination in the image arriving at the plane of the photodetectors is inversely proportional to the square of the ratio of the focal length to clear aperture. An alternative description uses the definition that the numerical aperture (NA) of the lens is the reciprocal of twice the f-number. The concept of depth of focus is that there exists an acceptable range of blur (due to defocussing) that will not adversely affect the performance of the optical system. The depth of focus is dependent on the wavelength of light, and, falls off inversely with the square of the numerical aperture. Truncation of illuminance patterns falling outside the microlens aperture results in diffractive spreading and clipping or vignetting, producing undesirable nonuniformities and a dark ring around the image.

The limiting numerical aperture or f-stop of the imaging camera's optical system is determined by the smallest aperture element in the convolution train. Typically, the microlens will be the limiting aperture in video camera systems. Prior Art is characterized by methods and structures to maximize the microlens aperture by increasing the radius of curvature, employing lens materials with increased refractive index, or, using compound lens arrangements to extend the focal plane deeper to match the multilayer span required to image light onto the buried photodiodes at the base surface of the semiconductor substrate. Light falling between photodiode elements or on insensitive outer zones of the photodiodes, known as dead zones, may cause image smear or noise. With Industry trends to increased miniaturization, smaller photodiodes are associated with decreasing manufacturing cost, and, similarly, mitigate against the extra steps of forming layers for Prior Art compound lens arrangements to gain increased focal length imaging. Since the microlens is aligned and matched in physical size to shrinking pixel sizes, larger microlens sizes are not a practical direction. Higher refractive index materials for the microlens would increase the reflection-loss at the air-microlens interface and result in decreased light collection efficiency and reduced spectral signal contrast or reduced signal-to-noise ratio. Limits to the numerical aperture value of the microlens are imposed by the inverse relationship of the depth of focus decreasing as the square of the numerical aperture, a strong quadratic sensitivity on the numerical aperture.

Typically, a pixel with a microlens requires a narrower incident light angle than a pixel that does not use a microlens, imposing additional optical design implications for the lens of the camera.

The design challenge for creating superior solid-state color imagers is, therefore, to optimize spectral collection efficiency to maximize the fill-factor of the photosensor array elements without vignetting (losses from overfilling) and associated photosensor cross-talk, and, with the minimum number of microelectronic fabrication process steps. The present invention is clearly distinguished from Prior Art by introducing at least one high transmittance planar film-layer of specified optical and physical properties directly over color-filters without the use of microlens arrays.

This distinction will be further demonstrated in the following sections by describing the specific related optical conditions to be satisfied at the interfaces between the functional layers comprising the semiconductor color-imaging device when no microlenses are used.

On colors only products where no microlens layer is formed, the color pixel surface is not flat. The curvature of the color filter surface will cause incident image light to refract and the image position and power-density (viz., irradiance distribution) at the sensor surface will be changed. These factors could have an effect on pixel sensitivity, signal contract and pixel cross-talk. In the colors only process, the final product wafer suffers significant topography step-height variations. During the package dicing step, residue particles remain embedded as a result of the topographical problem. The resulting entrapped residue particles impact the image quality and cause yield loss of CMOS/CCD image sensor products.

FIG. 1 exhibits the conventional Prior Art vertical semiconductor cross-sectional profile and optical configuration for color image formation. Microlens 1 residing on a planarization layer which serves as a spacer 2 collects a bundle of light rays from the image presented to the video camera and converges the light into focal cone 3 onto photodiode 8 after passing through color filter 4 residing on planarization layer 5, passivation layer 6, and metallization layer 7.

The purpose of the microlens' application in CCD and CMOS imaging devices is to increase imager sensing efficiency. FIG. 2 illustrates the geometrical optics for incident image light 9 converged by microlens element 10, color filter 11, into focal cone 12, to the focal area 13 within a photoactive area 14 surrounded by a dead or non-photosensitive area 15, wherein the sum of the areas of 14 and 15 comprise the region of the pixel.

Otsuka in U.S. Pat. No. 6,040,591 teaches a charge-coupled device (CCD) imaging array having a refractive index adjusting and planarizing layer over a microlens array layer to correct for non-normal angles of incidence affect on the image light convergence positions at the photosensor planar array and for interfacial reflection loss at the microlens surface. Otsuka assumed a typical refractive index value of $n=1.75$ for a reflowed polyimide resin microlens and selected a fluororesin from Asahi Glass Co., Ltd of refractive index $n=1.34$ for the index adjusting layer. That is, Otsuka uses an index of refraction for the refractive index adjusting layer which is lower than the microlens' index to assure bending image light rays inward toward the surface-normal to obviate vignetting at the sensor active area. FIG. 3 shows the CCD cross-sectional structure of the preferred embodiment of Otsuka's referenced patent, comprised of a photodiode 28, charge transfer portion 17, formed in a semiconductor substrate 16, having a vertical transfer electrode 18, a light shielding film 19 covering the vertical transfer electrode 18, a transparent flattening film 20 covering the photodiode 28 and light shield 18, a color filter 21 formed on the flattening film 20, a flattening film 22 formed on the color filter 21, a hemispherical microlens 23 formed on the transparent flattening film 22, and a transparent film 24 having refractive index lower than that of the microlens formed to cover the microlens. A final optional top-surface antireflection coating 25 is then formed on the film 24. Incident light, L, is shown to converge at the new, deeper focal point F, instead of the unadjusted shallower value of f0 which occurs when the index-adjusting film 24 is absent. It is noted, then, that the indices of refraction and all the prescribed layer thicknesses taught by Otsuka in the referenced patent correspond to optical designs accommodating the geometric and physical optical characteristics of the formed microlens, not those of the color filter layer(s). No special treatment or specified conditions are provided for adjustment of the planarizing spacer layer 22, nor are interface conditions between the color filter layers 21 and planarizing spacer layer 22 addressed.

The case of no microlens is not considered by Otsuka. Otsuka does consider using the index-adjusting layer as a transparent sealing resin which can be hardened and used to seal the solid-state imager as a package. It is noted that any contaminants captured in the microlens interstices will not be removed in a final cleaning process step, but will be sealed in as well. Results of embedded particulates will lead to light scattering noise effects.

An alternative approach to microlens optics and device cross-sectional adaptations, using refractive index structures configured to collect and converge image light onto the photodetecting surface of the pixel, is given by Furumiya in U.S. Pat. No. 5,844,290. It is noted that color filters, color image formation processes, and whether there is compatibility of Furiyama's structures with color filters are not discussed in Furiyama's referenced patent.

According to FIG. 4 in U.S. Pat. No. 5,844,290 by Furiyama, a preferred embodiment for the solid-state imager is comprised of a CCD structure formed of n-type silicon substrate 30, p-well 31, silicon-oxide film 38, in which are patterned n-type buried channel layer 34 above p-type layer 35, a pn junction photodiode of p+ type layer 33 above n-type layer 32 with p+ device isolation 36, and, device opening 42 and reading gate 34. Built up above the pn junction are transfer electrode 39, silicon oxide film 40, light shield film 41, insulator film 43, and, a first region of planarizing resin 45 vertically contiguous with a second region of planarizing resin layer 44, forming a top surface plane for microlens array 46.

The geometrical optics for capturing and converging image light to the photosensor plane of the CCD is depicted by normal incident light I gathered in a focal cone of the microlens. The extreme rays are refracted by the second (vertical) region of planarizing resin layer 44 into the first region of planarizing resin layer 45, to a focal point in proximity to the photodiode surface. The first region 45 is in the form of a cylindrical column and is positioned between the n-type layer 32 and a center portion of the microlens 46. The second region 44 surrounding the first region 45 has a refractive index larger than a refractive index of the first region, assuring the image light bends inwards toward the surface normal. This coaxial cylindrical arrangement can, as Furumiya states, be subject to reflection losses at the boundary between the planarizing resin layers. It is noted here for the Furumiya referenced patent, as well as we noted earlier for the Otsuko referenced patent, that the case of no microlens is not addressed.

U.S. Pat. No. 5,691,548 to Akio addresses the long focal length, film stack thickness, and vignetting problems common in Prior Art by introducing a compound lens arrangement comprised of a first positive or converging convex element in tandem with a negative or diverging (concave upward) second element. The principal problem Akio addresses is for low light levels the camera's aperture stop must be fully opened. Obliquely incident light rays will noticeably increase in their proportion to the total amount of all incident image light. Under these conditions, conventional solid-state imagers will truncate or vignette significantly, diminishing their optical sensitivity.

To solve this problem of conventional imagers not collecting and imaging light efficiently when the aperture is open fully, Akio teaches an optical arrangement so that a concave type microlens layer operates to collimate light rays collected by the convex lens so as to converge on the photosensor plane. The color image formation process and the case of no microlens is not addressed in the referenced Akio patent.

In U.S. Pat. No. 6,091,093 to Kang et al, an MOS semiconductor imager and microlens process is taught. In particular, embodiments of the invention are directed to create a number of gate islands electrically insulated from each other with spacers. The processes disclosed aims to integrate logic IC fabrication with photosensors. Conventional processes for polycide-gate or salicide-gate MOS devices generally introduce the problem of inherently forming opaque regions preventing image light from entering the photosensitive regions of the silicon at a distance below the surface. Kang et al teach a process for photocell construction without the conventional additional mask step to prevent the formation of the silicide over those silicon regions that are patterned for photodetectors. Spacers are formed above the pn-junction of the photodiode array elements such that incident light passes through the spacers and into the photosensitive region. As noted previously, Kang does not address the color formation process and his optical arrangements will not operate without a converging microlens.

The color filter process and optical film structures taught in the present invention are clearly distinguished from the Prior Art by eliminating microlenses, and, are shown to include fewer process steps with improved package final product yield.

BRIEF SUMMARY OF THE INVENTION

A principal object of the present invention is to teach the method and structures for adding a specified planarization layer after the final color filter layer formation in the colors only product in which there are no microlenses. Experiments conducted by the inventors have demonstrated that the present invention improves pixel sensitivity and reduces the package yield loss through the reduction of residual trapped particulates induced in the package dicing and cleaning steps. It is an object of the present invention to reduce interfacial reflection losses and vignetting of image light by disclosing a method, structures and optical properties required for refractive index boundary-engineering.

Another object of the present invention is to provide an adaptive process wherein antireflection and image-forming structures, spectral color filters, and, combinations or varying configurations of semiconductor vertical profiles can be integrated with the result of maximizing collection efficiency of image intensity patterns on the photodiode planar arrays to achieve optimum pixel resolution and color signal contrast with minimal smear and pixel cross-talk.

In accord with a principal object of the present invention, there is provided by the present invention a manufacturing method and microelectronic fabrication process sequence which minimizes the number and task-times of the operational steps required in the production of semiconductor arrays for color imaging devices.

Another object of the present invention is to provide an overcoat process allowing the widest and most forgiving process windows for color filters and semiconductor integration reproducibility, high reliability, and, consequently maximum process and package yield.

A further object of the present invention is to obviate topographical step variations, non-planarity and surface roughness problems encountered with conventional Prior Art formation sequences. Prior Art is well known to have step-height or steric effect variations between R/G/B layers and results in departures from designer's specifications in transmittance color-balance.

Avoidance of the specific color pixel lifting problem is a still further object of the present invention.

To practice the method of the present invention, conventional microelectronic fabrication techniques using photolithographic materials, masks and etch tools are employed: in succession the array of pn-junction photodiodes is patterned with impurity dopants diffused or ion-implanted, electrically isolated, and planarized over. In the present invention, the colors only process is disclosed wherein color filters are geometrically patterned to assemble primary green, red, and blue color filters formed by the addition of suitable dyes or pigments appropriate to the desired spectral transmissivity to be associated with specified photodetector coordinate addresses in the imager matrix and the algorithm for synthetic color image reconstruction. The microlens process steps have been eliminated in the colors only process. A final specified planarization layer is applied directly above the color filter layer to complete the colors only process. The flat top surface is optimal for the package dicing and final cleaning treatment steps, minimizing particle residues and maximizing product final yield.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 1 is a simplified schematic cross-sectional profile of semiconductor and optical structures showing a typical order of elements of a conventional Prior Art device for color image formation.

FIG. 2 illustrates the geometrical optics factors for microlens imaging onto the photosensitive active zone within a square pixel area.

FIG. 3 depicts the cross-sectional structure and image converging optical paths for a Prior Art CCD imager with a single-layer microlens, refractive index adjusting overcoat and top surface antireflection film layer.

FIG. 4 demonstrates a Prior Art cross-sectional structure and image light collection scheme using vertical coaxial cylindrical sections of higher and lower refractive indices.

FIG. 5A-5B shows the precedence flow-chart of the process options of the present invention.

DESCRIPTION OF THE PREFERRED EMBODIMENTS

The present invention discloses a significantly simplified fabrication sequence and the specific optical conditions and materials' properties to be satisfied in forming a planar film layer of high transmittance material over at least one layer of color filters to enable high efficiency integrated semiconductor array color imaging devices without microlenses.

Figure 5B:
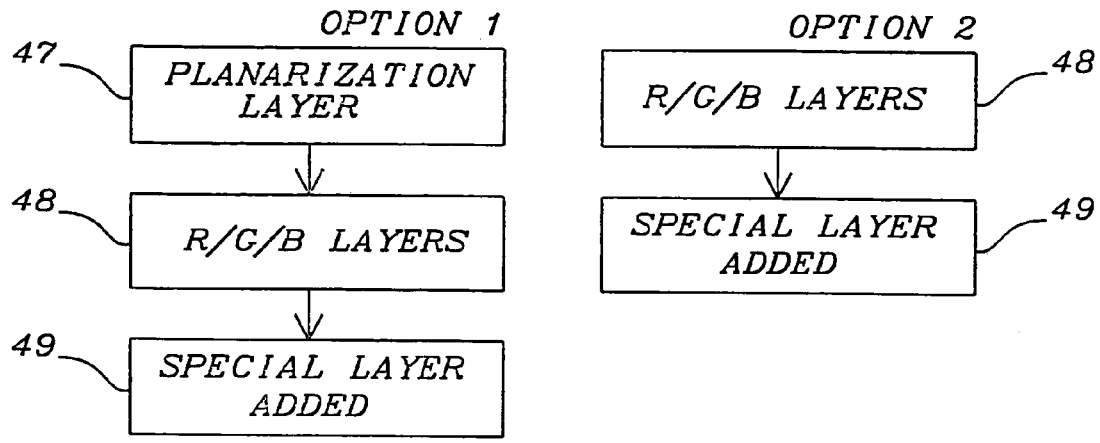

FIG. 5A and FIG. 5B depicts the simplified comparative fabrication flow-charts of the new process of the present invention which distinguish it from the sequence of the Prior Art process. In accord with the flow-charts shown, the manufacturing method of the present invention teaches priority formation of a high transmittance planarizing layer directly above a color filter layer residing above the sensor elements of the matrix array comprising the semiconductor imager. In the Prior Art process exhibited in FIG. 5A option 1 deposits planarization layer 47 prior to color filter formation 48. In FIG. 5A option 2 eliminates the planarizing layer and directly deposits the primary color filters 48 above the photodiode array. By contrast, FIG. 5B discloses two options, both of which teach a final special layer 49; in option 1, special layer 49 is deposited after planarizing layer 47 and color filter layer 48 are formed; in option 2, layer 49 follows direct deposition of the color filter layer above the photodiode portion of the pixel.

Figure 6A:
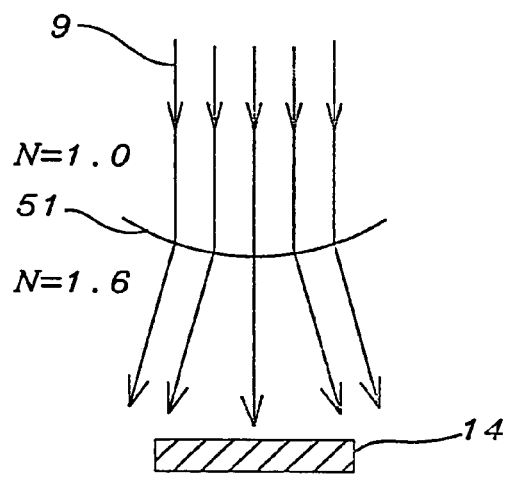
FIG. 6A depicts the geometric optics problem of vignetting suffered by Prior Art processes.

FIG. 6A exhibits the image light collection problem suffered in Prior Art processes and structures. In FIG. 6A, incident image light 9 from the camera optics is incident normal to the surface of the solid-state imager, passing from a region of index of refraction N=1 (air) into the semiconductor film layers with typical resin refractive index of N=1.6. Refraction of the ray bundle results in the outermost rays missing the image plane (vignetting) comprised of the photosensor active area, and, impinging on the spaces between the photodiode elements. Light arriving outside the photoelectronic portion of the pixel diminishes sensitivity, signal-to-noise contrast, and induces the phenomenon referred to as "smear" related to the cross-talk effect.

Figure 6B:
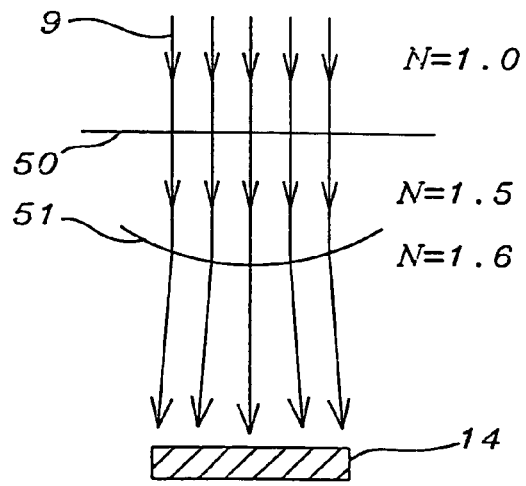
FIG. 6B shows the general ray trace solution of the new process of the present invention to prevent vignetting off the photodetector active area.

The new process of the present invention is illustrated in FIG. 6B which shows a simple ray-trace for the case of direct deposition of the color filters above the photosensor portion of the pixel followed by a specified planarizing layer. In FIG. 6B, normal incident image light 9 to the planarizing surface 50 enters from air to a material, such as a resin or polymer, of refractive index N closely matched to that of the color filter layer, and, suffers significantly less refraction at the index interface surface 51, to arrive at the image plane to fill the active area of the photodiode 14 to a very high order of approximation. A typical case is illustrated for air N=1.0, planarizing layer N=1.5, and for the color filter layer N=1.6.

Figure 7:
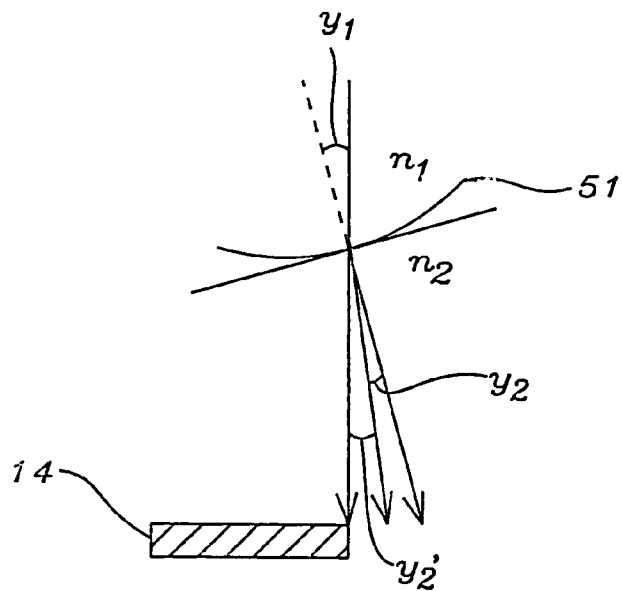
FIG. 7 is a diagram used to explain an optical path of incident light to the photodetector active area, according to the present invention.

An important attribute of the new colors only process of the present invention is the conformal concave contour of the interface surface 51 shown in FIG. 6B between the color filter layer produced by direct deposition above the photodiode array 14 of the CCD imager. This refractive index surface contour corresponds to the topology of the CCD semiconductor device shown in FIG. 8A and FIG. 8B in the region above the pn-junction 57. FIG. 7 explains the optical physics of the affect of increasing the difference in the index of refraction across the "pixel surface" 51:

light ray 9 incident to the "pixel surface" 51 at an angle $\theta_1$ to the surface-normal from a medium of index N1 is refracted at an angle $\theta_2$ depending on the value of the refractive index N2, according to Snell's Law of Refraction:

$$N1 \sin \theta_1 = N2 \sin \theta_2 \qquad \text{eq.(1)}$$

If N1>N2, then $\theta_2 > \theta_1$.

For example, if N1=1.10 (air) and N2=1.6 (color filter layer), and if $\theta_1$=30 degrees, then $\theta_2$=18 degrees. But, if N1=1.5 (specified planarizing layer) and N2=1.6 (color filter layer) and $\theta_1$=30 degrees, then $\theta_2'$=28 degrees (where ' denotes "prime").

Figure 8A:
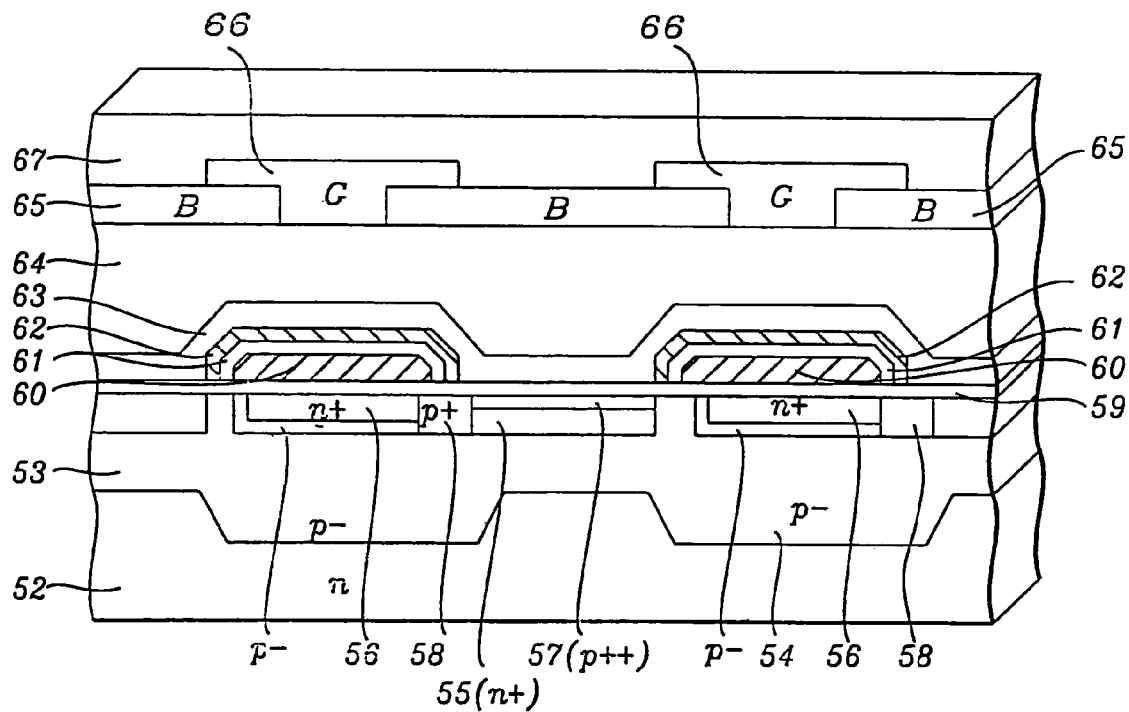
FIG. 8A shows the color pixel arrangement along a first principal axis perpendicular to the plane of the cross-section of the semiconductor imaging device.

FIG. 8A depicts the cross-sectional view of the preferred embodiment of the present invention, showing in particular the priority formation of the color filter array in mutual registration with the photoactive regions of the solid-state array imager. FIG. 8A illustrates the case of a CCD imager fabrication sequence, but it is clearly recognized that the present invention equally well applies to charge-injection device (CID) imagers and CMOS imagers. In FIG. 8A, an "n" (negative) type semiconductor substrate 52, is photolithographically patterned by suitable photoresist coating, masking, exposing and developing, to open regions for ion-implant or diffusion doping by selected impurity atoms to form p-(weakly doped positive) type wells 53 and 54. With similar photolithography steps, ion-implants or diffusions, an n+ type region 55 is formed to create a pn-junction photodiode and a vertical charge coupled device 56. A highly doped positive impurity, p++, is introduced selectively to form a surface isolation layer 57, and, a p-type well 58 is formed to isolate the CCD device 56. To isolate pixels, a p+ channel stop 58 is formed. The gate insulator 59 is then applied over the surface of the substrate. The vertical profile is completed by processing successive additions of transmission gate 60, interlevel insulator 61, light-shielding layer 62, passivation layer 63, optional planarization layer 64 (cf., FIG. 5B option 1), and in accord with the preferred embodiment of the present invention, color filters 65 for blue (also denoted B) and 66 for green (also denoted G).

Figure 8B:
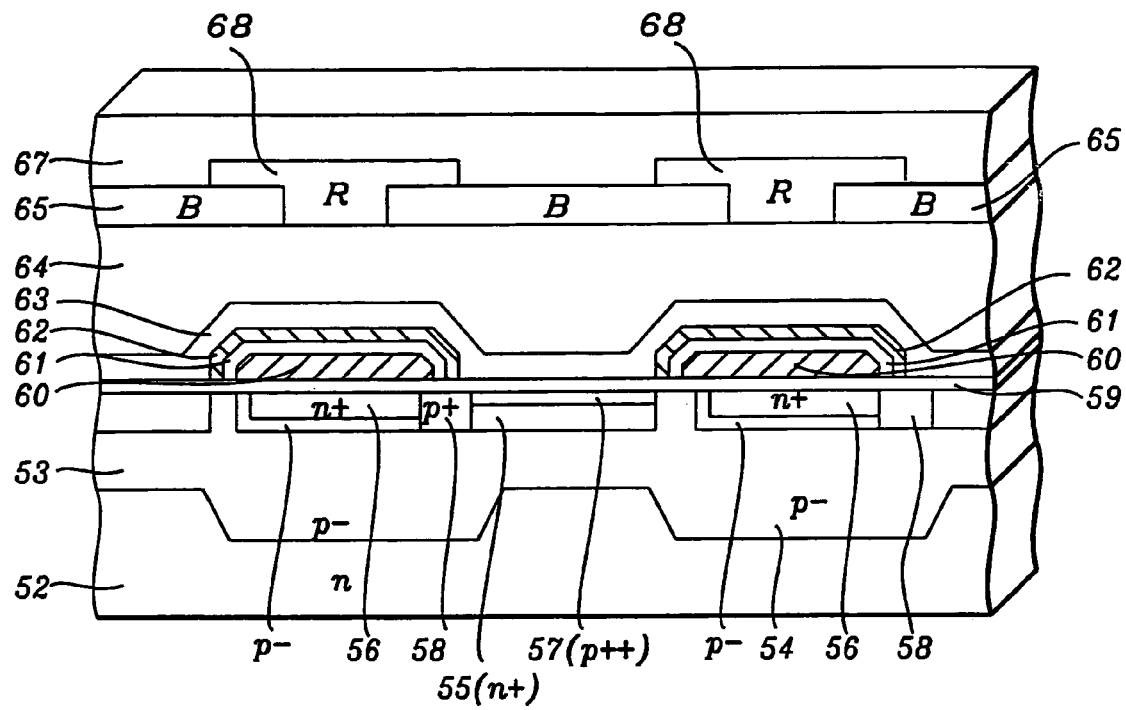
FIG. 8B shows the color pixel arrangement along a second principal axis orthogonal to the first principal axis of FIG. 8A and perpendicular to the cross-sectional plane of the semiconductor imaging device.
Figure 9:
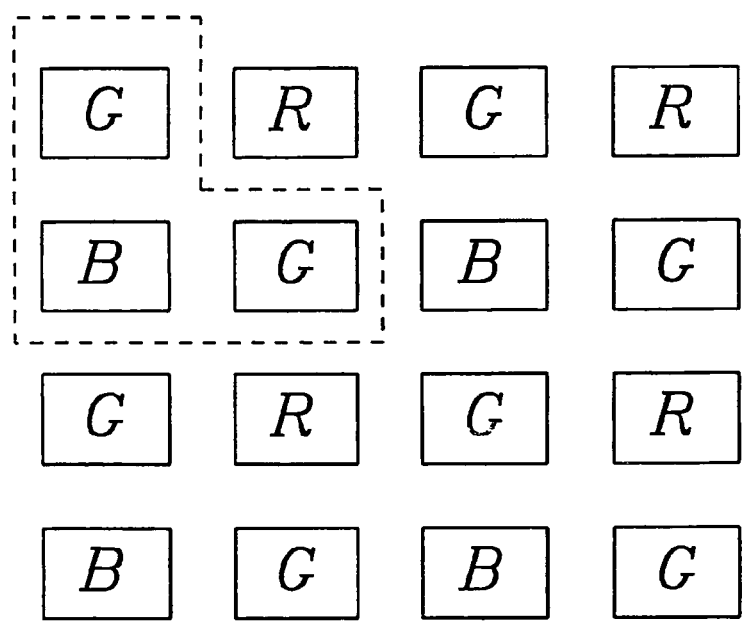
FIG. 9 illustrates a possible pixel combination for color image synthesis corresponding to the arrangement of color filters shown in FIG. 8.

FIG. 8B exhibits the second dimension of the color filter plane formation process, showing the orthogonal direction to that of FIG. 8A. All other semiconductor device structures remain the same for both figures. FIG. 8B shows the pixel sequence with the color filter 68 for red (also denoted by R) and the adjacent color filter 65 for blue (B). The color only process is then completed with the deposition of an encapsulant and planarization layer 67, as specified in accord with the present invention. Thus, the two-dimensional array of color filters provides the color pixel arrangement for synthetic reconstruction of camera images without microlenses. FIG. 9 illustrates a possible RBG color pixel arrangement, shown inscribed within the dashed-line.

The processes and structures shown in FIG. 8 will inherently create the pixel surface 51 of FIG. 6 by the conformal nature of the process film deposition in forming the color filter layer(s) above the photodiode regions of the imaging array. The present invention corrects this inherent concave pixel surface with the index matching planarizing layer directly deposited after color filter layer formation. Without an index-matched interface, the concave-up pixel surface will behave as a concave (negative or diverging) lens element and result in overfilling the photodiode active area. The features described here are highly reproducible since they result from precision lithographic patterning and overlays. The resulting structure provides a high degree of final top surface flatness which eliminates the topography problems for entrapment of residual particles after package dicing and cleaning.

The resulting colors only imaging device has, therefore, eliminated the complex and costly steps of Microlens formation while sustaining high light collection and pixel sensitivity with reduced cross-talk.

While the invention has been particularly shown and described with reference to the preferred embodiments thereof, it will be understood by those skilled in the art that various changes in form and details may be made without departing from the spirit and scope of the invention.

The invention claimed is:

1. A color imaging device, comprising:
   a substrate;
   a photosensor disposed above said substrate;
   a passivation coating disposed above the photosensor;
   a color filter layer disposed over the passivation coating; and
   an upper layer formed over the color filter layer;
   wherein the upper layer has an index of refraction that closely matches an index of refraction of the color filter layer.

2. The color imaging device of claim 1, wherein the color filter layer comprises a plurality of color filters.

3. The color imaging device of claim 2, wherein the plurality of color filters comprise first, second and third groups of color filters comprising red, green and blue color filters, respectively.

4. The color imaging device of claim 3, wherein the photosensor comprises a plurality of photosensors, and the first, second and third groups of color filters are registered with respective first, second and third sets of said plurality of photosensors.

5. The color imaging device of claim 1, wherein the device does not include microlenses.

6. The color imaging device of claim 1, wherein the upper layer has an index of refraction that is lower than an index of refraction of the color filter layer.

7. The color imaging device of claim 6, wherein the upper layer has an index of refraction of 1.5, and the color filter layer has an index of refraction of 1.6.

8. A color imaging device comprising:
   a plurality of photosensors;
   a photoshield layer over said plurality of photosensors;
   a passivation layer over said photoshield layer;
   a color filter layer over said passivation layer; and
   a planarization layer over said color filter layer, the planarization layer having an index of refraction that closely matches an index of refraction of the color filter layer:

9. The color imaging device of claim 8, wherein the device does not include microlenses.

10. The color imaging device of claim 8, wherein the color filter layer comprises a plurality of color filters, and said plurality of color filters comprise first, second and third groups of color filters comprising red, green and blue color filters, respectively.

11. The color imaging device of claim 10, wherein the first, second and third groups of color filters are registered with first, second and third groups, respectively, of said plurality of photosensors.

12. The color imaging device of claim 8, wherein the planarization layer has an index of refraction that is lower than an index of refraction of the color filter layer.

13. The color imaging device of claim 12, wherein the planarization layer has an index of refraction of 1.5, and the color filter layer has an index of refraction of 1.6.

14. A color imaging device comprising:
   a substrate having a plurality of photosensors;
   a light shield layer above said plurality of photo sensors;
   a passivation layer above said light shield layer;
   a color filter layer above said passivation layer; and
   a top layer above the color filter layer; said top layer having an index of refraction that closely matches an index of refraction of the color filter layer.

15. The color imaging device of claim 14, wherein the color filter layer comprises a plurality of color filters.

16. The color imaging device of claim 15, wherein the plurality of color filters comprises first, second and third groups of color filters comprising red, green and blue color filters, respectively.

17. The color imaging device of claim 15, wherein the first, second and third groups of color filters are registered with first, second and third groups, respectively, of said plurality of photosensors.

18. The color imaging device of claim 14, wherein the device does not include microlenses.

19. The color imaging device of claim 14, wherein the top layer has an index of refraction that is lower than an index of refraction of the color filter layer.

20. The color imaging device of claim 19, wherein the top layer has an index of refraction of 1.5, and the color filter layer has an index of refraction of 1.6.

* * * * *